US006228760B1

(12) United States Patent
Yu et al.

(10) Patent No.: US 6,228,760 B1
(45) Date of Patent: May 8, 2001

(54) USE OF PE-SiON OR PE-OXIDE FOR CONTACT OR VIA PHOTO AND FOR DEFECT REDUCTION WITH OXIDE AND W CHEMICAL-MECHANICAL POLISH

(75) Inventors: Chen-Hua Yu; Syun-Ming Jang; Tsu Shih; Anthony Yen; Jih-Churng Twu, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/263,563

(22) Filed: Mar. 8, 1999

(51) Int. Cl.[7] .............................................. H01L 21/4763

(52) U.S. Cl. .......................... 438/636; 438/637; 438/634; 438/672; 438/680; 438/970

(58) Field of Search .................................... 438/636, 637, 438/672, 680, 970, 634

(56) References Cited

U.S. PATENT DOCUMENTS

| | | | |
|---|---|---|---|
| 5,354,712 | 10/1994 | Ho et al. | 437/195 |
| 5,674,784 | 10/1997 | Jang et al. | 437/195 |
| 5,766,974 | 6/1998 | Sardella et al. | 437/195 |
| 5,767,018 | 6/1998 | Bell | 438/696 |
| 6,114,235 * | 9/2000 | Foote et al. | 438/636 |

* cited by examiner

*Primary Examiner*—John F. Niebling
*Assistant Examiner*—David A. Zarneke
(74) *Attorney, Agent, or Firm*—George O. Saile; Stephen B. Ackerman; William J. Stoffel

(57) ABSTRACT

A method forming a protective (SiON or PE-Ox) dielectric anti-reflective coating (DARC) over a di electric layer after a chemical-mechanical polish dielectric layer planarization process and before a chemical-mechanical polish of a conductive layer used in a contact or via plug formation. A dielectric layer is chemical-mechanical polished thereby creating microscratches in the dielectric layer. The invention's protective SiON or PE-OX DARC layer is formed over the dielectric layer whereby the protective SiON or PE-OX DARC layer fills in the microscratches. A first opening is etched in he protective layer and the dielectric layer. A conductive layer is formed over the protective layer and fills the first opening. The conductive layer is chemical-mechanical polished to remove the conductive layer from over the protective layer and to form an interconnect filling the first opening. The protective SiON or PE-OX DARC layer is used as a CMP stop thereby preventing microscratches in the dielectric layer.

7 Claims, 5 Drawing Sheets

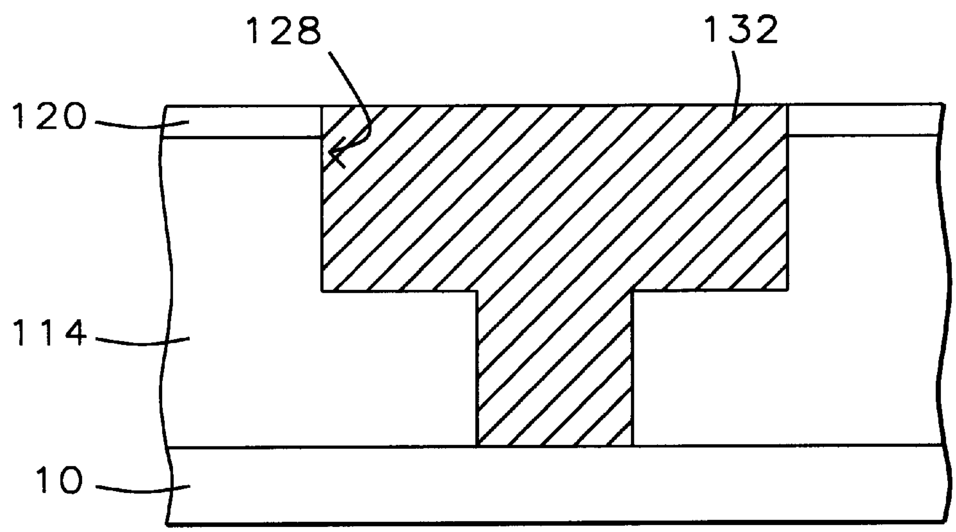
FIG. 7
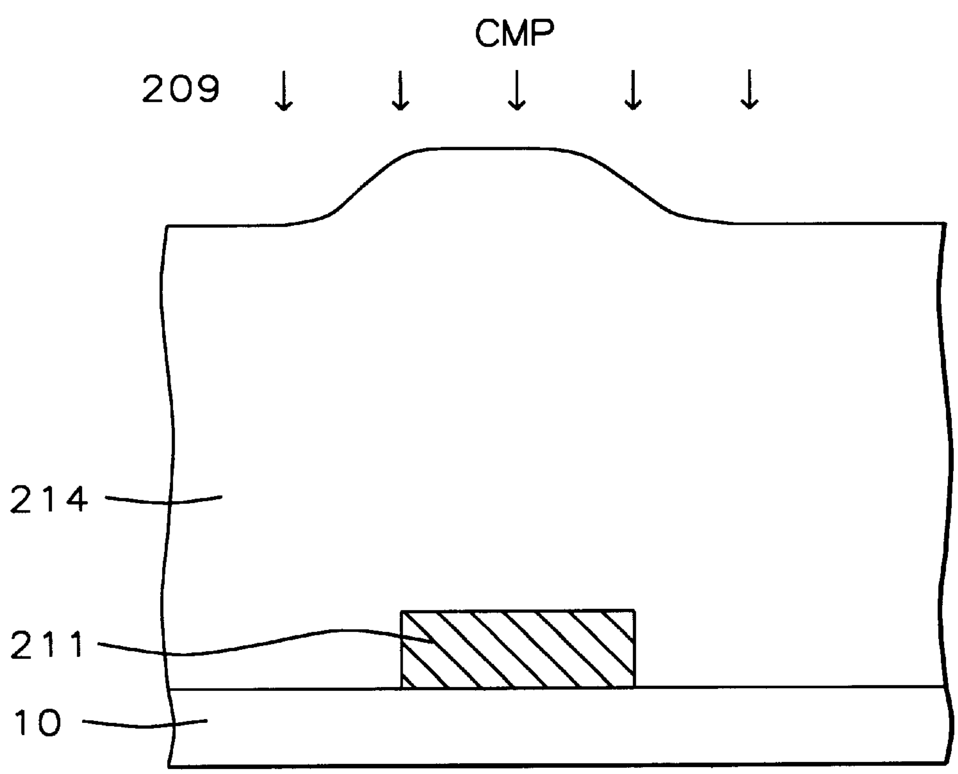
FIG. 8A – Prior Art

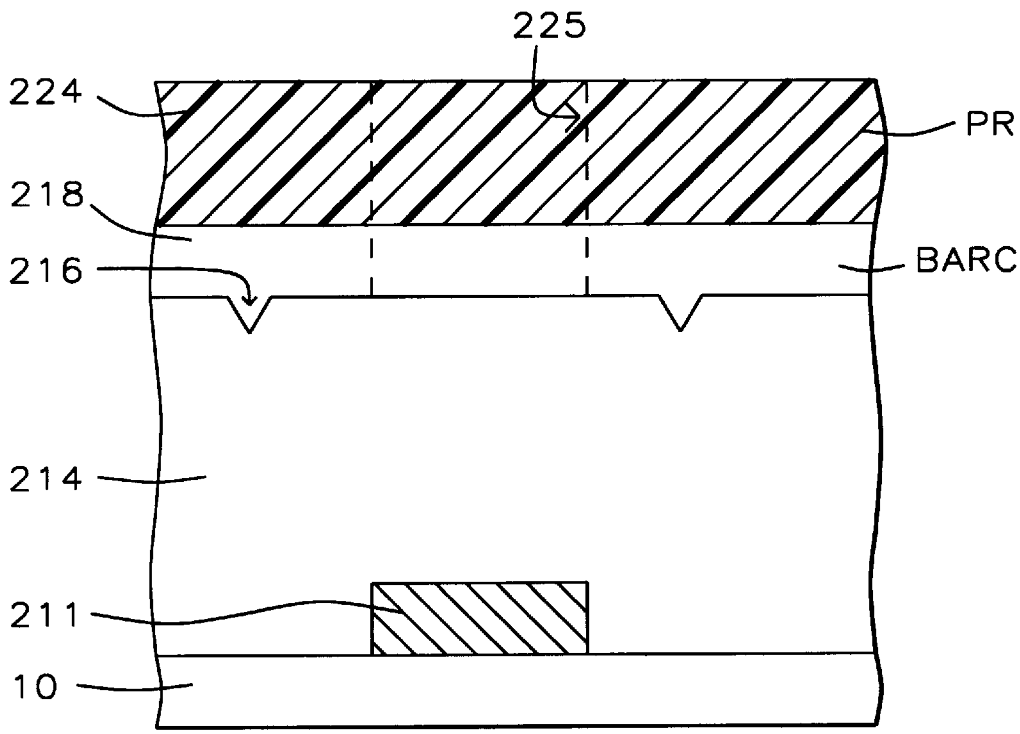
FIG. 8B - Prior Art
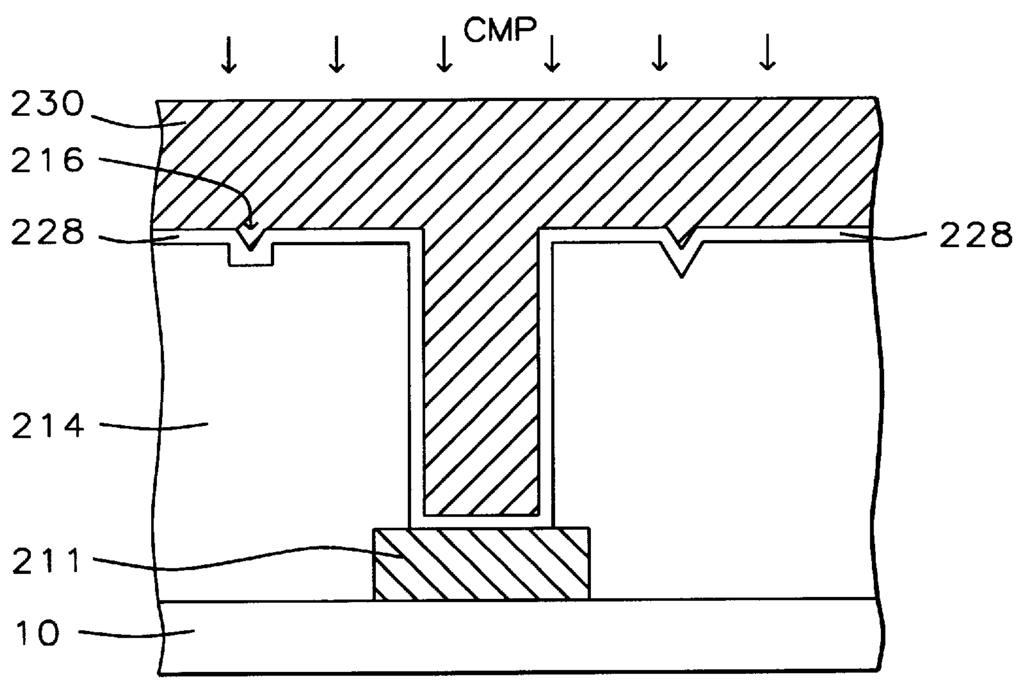
FIG. 8C - Prior Art

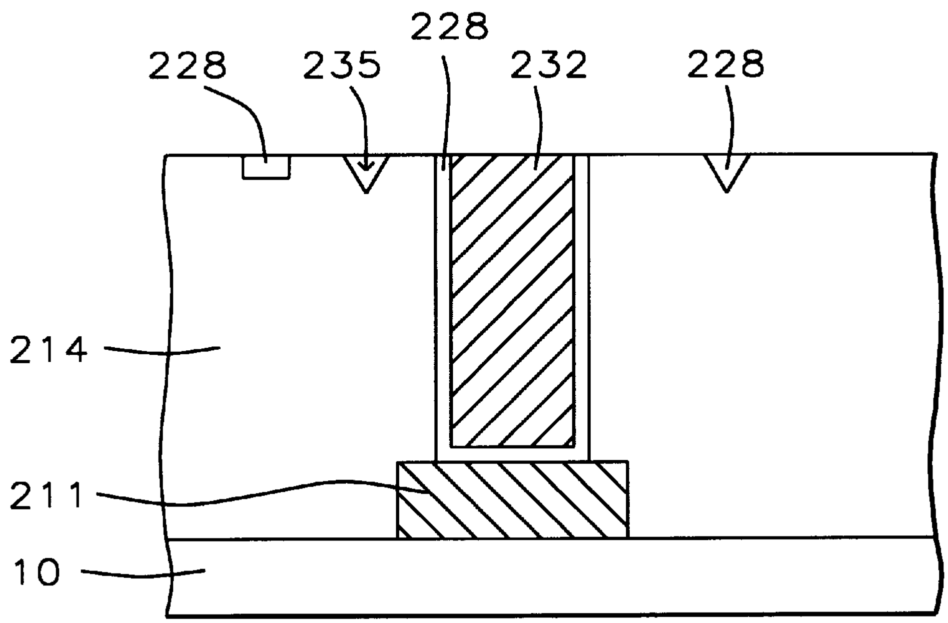
FIG. 8D – Prior Art

USE OF PE-SiON OR PE-OXIDE FOR CONTACT OR VIA PHOTO AND FOR DEFECT REDUCTION WITH OXIDE AND W CHEMICAL-MECHANICAL POLISH

BACKGROUND OF INVENTION

1) Field of the Invention

This invention relates generally to fabrication of contact or via holes using an Anti-Reflection Coating and chemical-mechanical polishing processes in semiconductor devices and more particularly to the fabrication of an Anti-Reflection Coating composed of Silicon oxynitride (SiON) and chemical-mechanical polish processes used in making contact holes or via holes in ILD or IMD dielectric layers.

2) Description of the Prior Art

Chemical-mechanical polish (CMP) planarization processes are used to level dielectric layers and to polish down metal layer in semiconductor devices. However, these CMP process can create microscratches in dielectric layers that degrade photolithographic performance and create defects. The inventor (s) have found the following problems as described below and in FIGS. 8A to 8D. This is not prior art for the patentability of the invention.

FIG. 8A shows the chemical-mechanical polishing 209 of a dielectric layer 214 overlying a metal line 211 on a substrate 10. FIG. 8B shows the microscratches 216 the inventor has noticed after the chemical-mechanical polish.

Next, an organic bottom anti-reflective coating (BARC) layer 218 and a photoresist layer 224 are formed over the dielectric layer 214 and the microscratches 216. The organic BARC layer 218 and a photoresist layer 224 are exposed to create a photoresist opening 225 (shown as dashed lines).

A problem the inventor has noticed is that the microscratches create reflections that degrade the photoresist pattern.

Next, a via hole is etched in the dielectric layer 214 as shown in FIG. 8C. The photoresist layer is removed.

As shown in FIG. 8C, a barrier layer 228 and metal layer 230 are formed over the dielectric layer and fill the via hole. The barrier layer and metal layer fill in some of the microscratches.

FIG. 8D shows the CMP of the metal layer and barrier layer to form the metal plug 323. However, the microscratches 216 are filled with metal and barrier layer 228. These filled microscratches create defects, short with overlying conductive lines and create photo defects.

Moreover, new microscratches 245 are formed in the dielectric layer by the metal CMP. These new metal chemical-mechanical polish created microscratches 245 cause similar problems.

Therefore, there is a need for a method to prevent microscratches in dielectric layers formed during contact/via hole formation and contact plug/via plug CMP processes.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,766,974 (Sardella)—Method of making a dielectric structure for facilitating overetching of metal without damage to inter-level dielectric—that shows an integrated circuit fabrication with a thin layer of oxynitride atop the interlevel dielectric, to provide an etch stop to withstand the overetch of the metal layer. U.S. Pat. No. 5,767,018 (Bell) shows polysilicon etch process using an ARC layer. U.S. Pat. No. 5354712 (Ho)Method for forming interconnect structures for integrated circuits—teaches dielectric layer that is chemical-mechanical polished. U.S. Pat. No. 5,674,784 (Jang et al.) shows a method of forming a polish stop for a CMP process.

SUMMARY OF THE INVENTION

It is an object of the present invention to provide a method of covering microscratches created by a chemical-mechanical polishing of a dielectric layer using a SiON layer.

It is an object of the present invention to provide a method provides a method of preventing/filling microscratches in a dielectric layer created by a chemical-mechanical polishing of a conductive layer in a contact or via plug formation process using a dielectric Anti-Reflection Coating (DARC) SiON layer.

To accomplish the above objectives, the present invention provides a method forming a protective dielectric anti-reflective coating (DARC) layer composed of Silicon oxynitride (SiON) or a Plasma enhanced oxide (PE-oxide) layer 20 over a dielectric layer after a chemical-mechanical polish planarization and before a chemical-mechanical polish of a conductive layer used in a contact or via plug formation. The invention has two embodiments for the composition of the protective DARC layer (1) SiON and (2) PE-Oxide. A invention's method of forming a protective Silicon oxynitride (SiON) dielectric anti-reflective coating (DARC) or PE-oxide DARC for a contact or via opening includes the following.

A dielectric layer is formed over a semiconductor structure. The dielectric layer is chemical-mechanical polished whereby the chemical-mechanical polish creates microscratches in the dielectric layer. The invention's key protective dielectric anti-reflective coating (DARC) layer (SiON or PE-Ox) is formed over the dielectric layer whereby the protective dielectric layer fills in the microscratches in the dielectric layer. The SiON DARC layer is formed using a plasma enhanced chemical vapor deposition process. A photoresist layer is formed over the dielectric anti-reflective coating (DARC) layer. The photoresist layer is exposed and developed to create a first resist opening. The SiON DARC layer and the dielectric layer are etched through the first resist opening to form a first opening. The first opening can expose a contact area on the substrate or a conductive line over the substrate. The photoresist layer is then removed. A conductive (e.g., metal) layer is formed over the SiON DARC layer and fill the first opening. The conductive layer is chemical-mechanical polished to remove the conductive layer from over the SiON DARC layer and to form an interconnect filling the first opening. The SiON DARC layer is used as a CMP stop whereby the SiON DARC layer prevents microscratches in the dielectric layer. The element numbers in the summary of the invention do not limit the scope of the claimed invention but only allow a better understanding of the general invention. In the description above, the Invention's protective layer can alternatively be composed of PE-oxide.

The invention provides the following benefits. The invention's protective SiON or PE-oxide DARC layer provides superior anti-reflective characteristics especially when applied to deep ultra violet (DUV) photo processes. The invention's DARC layer eliminates the need to use an organic BARC. The inventor has found that compared to a Organic BARC, SiN ARC layer or oxide layer not formed using a plasma enhanced process, the invention SiON and PE-Ox layer has unexpected superior anti-reflective characteristics and scratch filling properties.

Moreover, the invention's DARC layer fills in microscratches in dielectric layer from previous chemical-mechanical polishing planarization processes.

The invention's SiON DARC layer also is a superior CMP stop layer for the metal fill CMP. The protective DARC layer prevents microscratches form chemical-mechanical polish processes.

In all these aspects, the invention's SiON layer is superior to a Silicon nitride layer or a SiN/SiON Stack or a oxide not formed using a PE process.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 7 is a cross sectional view that shows a preferred embodiment where the first opening is a dual damascene process according to the present invention.

FIGS. 8A, 8B, 8C, and 8D are cross sectional views for illustrating a prior art method of the inventors for forming a via opening where microscratches from chemical-mechanical polish processes degrade the photo performance.

DETAILED DESCRIPTION OF THE PREFERRED EMBODIMENTS

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art. Likewise for powers, electrode gaps and other settings for reactors.

The method of forming a SiON dielectric anti-reflective coating (DARC) (composed of SiON or PE-oxide) for a contact or via opening is explained below.

Figure 1:
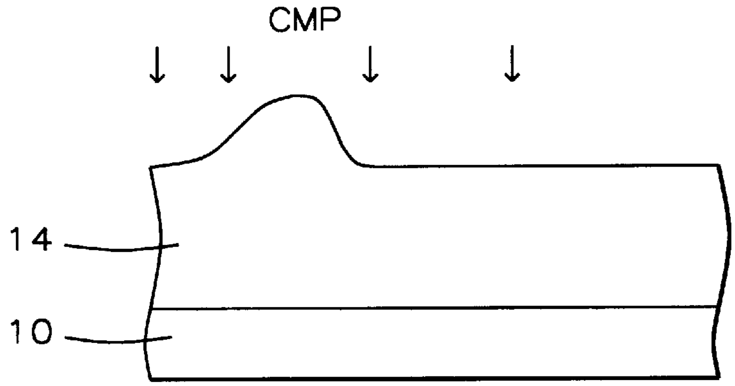
FIGS. 1, 2, 3, 4, 5, and 6 are cross sectional views for illustrating a method for manufacturing a SiON DARC layer and contact/via hole according to the present invention.

As shown in FIG. 1, a dielectric layer 14 is formed over a semiconductor structure 10. The dielectric layer is an interlevel dielectric or a inter metal dielectric layer.

That is the dielectric layer (ILD Layer) can be formed on a wafer and on other devices like FETs. Also, as an inter metal dielectric (IMD) layer, the dielectric layer can be formed over conductive lines over the ILD layer.

The inventor has found that the dielectric layers composed of oxides formed by $O_3$ TEOS processes, or composed of low-k materials, such as. Hydrogen-Silsesquioxane spin-on-glass (HSQ-SOG), and SOG are particularly vulnerable to scratching from dielectric and metal chemical-mechanical polishing steps.

Figure 2:
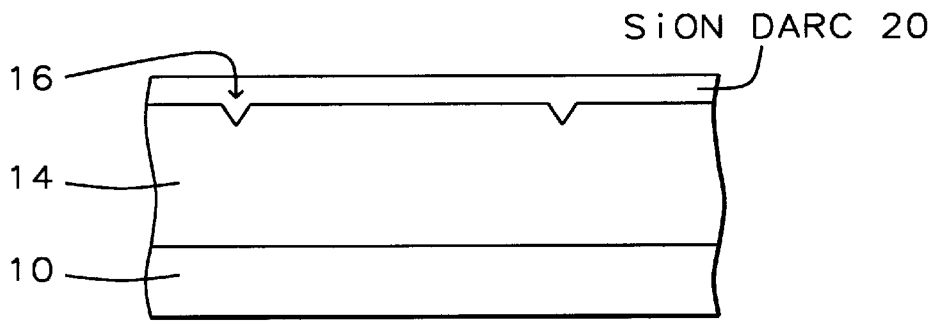

Referring to FIG. 2, the dielectric layer 14 is chemical-mechanical polished. A problem the inventor has noticed is that the chemical-mechanical polish often creates microscratches 16 in the dielectric layer. These microscratches can have a depth from 300 to 500 Å.

Invention's Key DARC layer 20

In a key step, FIG. 2 shows that the invention's protective layer 20. In the first embodiment of the invention the protective layer is composed of a silicon oxynitride Dielectric anti-reflective coating (SiON DARC) layer 20 and is formed over the dielectric layer 14. Alternately, in the second embodiment of the invention, the protective layer 20 can be formed of PE-oxide. In following description will refer to the protective layer as the SiON DARC layer, but it is understood that the protective layer can also be formed of PE-oxide. The SiON dielectric or PE-oxide layer 20 fills in the microscratches 16 in the dielectric layer 14 after the chemical-mechanical polish in step (b). The SiON DARC layer is formed using a plasma enhanced chemical vapor deposition process.

The protective (SiON or PE-oxide) DARC layer 20 has several key properties. First, the DARC layer fills in the microscratches. The DARC is highly conformal. Second, the DARC layer 20 as formed by the invention's process, has excellent anti-reflective coating characteristics. Third, the SiON DARC layer is an excellent CMP stop that prevent a subsequent CMP process from scratching the underlying dielectric layer.

The SiON DARC layer preferably has a thickness of between about 300 and 1400 Å (tgt=1600 Å) and a index of refraction of preferably between 2 and 2.3 at a wavelength of 248 nm and a coefficient of extinction between 0.6 and 0.7 and a molar concentrations of between 42 to 47% Si and 36 to 40% O, and 5 to 9% N and 8 to 12% H and most preferable plus /minus 1% of 45% Si (44% to 46% H) and 38% O (37% to 39% O), and 7% N (6% to 8% N) and 10% H (9% to 11% H).

The preferred process to make the DARC PE-SiON layer is as follows: Temperature between 300 and 400° C., pressure between about 5 and 6 torr, $SiH_4$ gas flow between 60 and 80 sccm, He gas flow between 1900 and 2300 sccm, a $N_2O$ flow between 90n and 1210 sccm, and a power between 100 and 150 W. The invention's SiON DARC layer 20 owns it's ARC characteristics to the low deposition rate that also even, uniform film deposition that is conformal thereby allowing better photo critical dimension (CD) control. It is critical to the invention that the SiON is a PE process.

The $2^{nd}$ embodiment of the invention's protective DARC layer 20 is composed of PE-oxide and preferably has a thickness of between about 500 and 2000 Å for a DUV photo process at a wavelength 248 nm.

Figure 3:
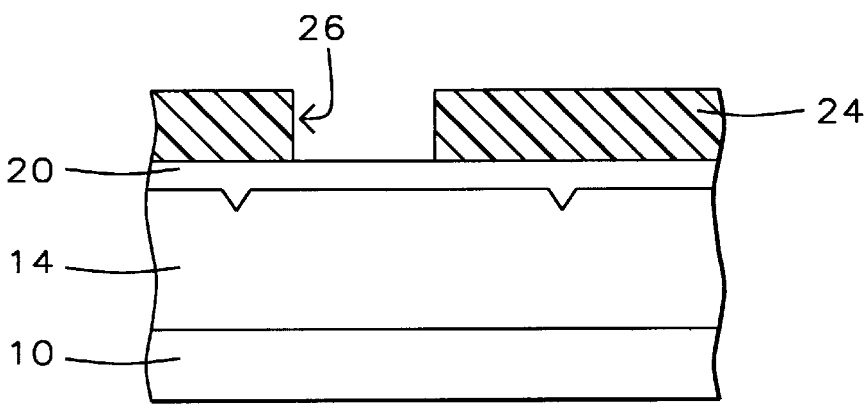

FIG. 3 shows a photoresist layer 24 is formed over the dielectric anti-reflective coating (DARC) layer. The photoresist layer 24 preferably has a thickness of between about 6000 Å and 1 $\mu$m. The photoresist is preferably a DUV photoresist.

Still referring to FIG. 3, the photoresist layer 24 is exposed and developed to create a first resist opening 26. The photoresist layer 24 is preferably exposed using I-line DUV light with a wavelength between 245 and 264 nm. The invention's SiON or $SiO_2$ DARC 20 can work as an ARC with other light at different wavelengths (such as 268 nm), but the thickness of the DARC will need to be changed.

Figure 4:
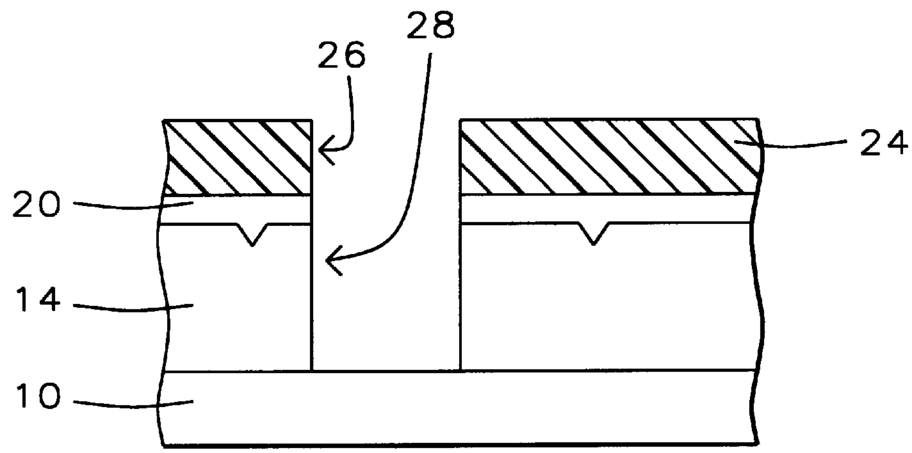

As shown in FIG. 4, the protective DARC layer 20 and the dielectric layer 14 are etched through the first resist opening 26 to form a first opening 28.

The first resist opening 26 preferably has an open dimension between about 0.2 and 0.4 $\mu$m.

The first opening can have many shapes. For example, as shown in FIG. 7, the first opening can be a dual damascene shaped opening 128 and the interconnection 132 is a dual damascene interconnection. The first opening can be formed using a multi-step etch/photo process. The first opening can expose a contact area on the substrate or a conductive line over the substrate.

Figure 5:
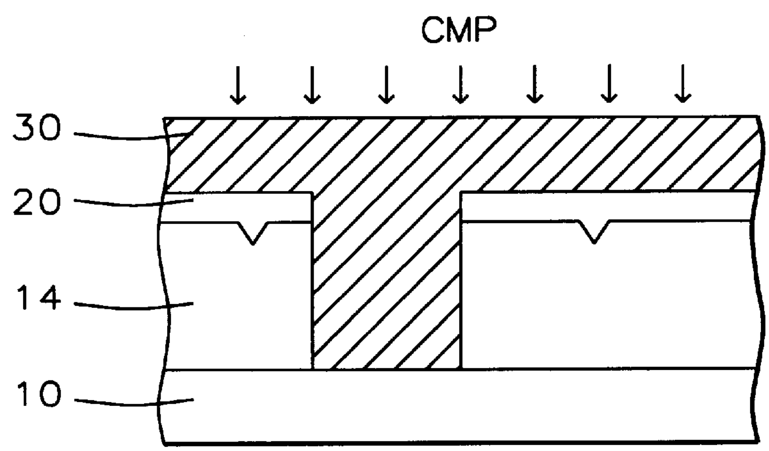
Figure 6:
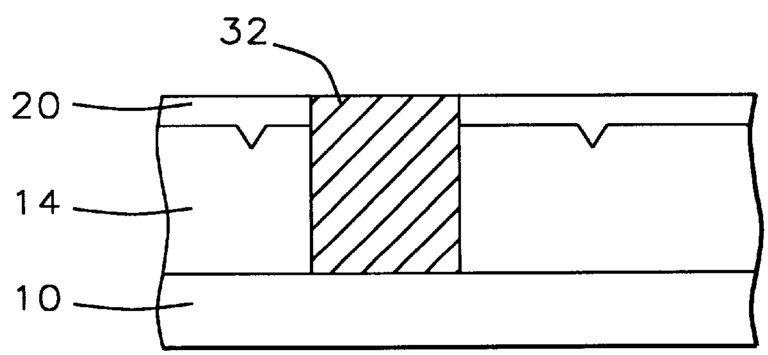

As shown in FIG. 5, the photoresist layer 24 is then removed.

Next, a conductive (e.g., metal) layer 30 is formed over the protective DARC layer 20 and fill the first opening. The metal layer can be Tungsten or a multi-layer such as a barrier/adhesion layer (such as TiN) and a conductive layer such as tungsten. The composition of the conductive layer 30 can vary depending on whether the layer is a contact though a IDL layer to the substrate or a via plug in an IMD Layer to a metal lines.

FIG. 5 show the conductive layer 30 is chemical-mechanical polished to remove the conductive layer 30 from over the SiON DARC layer 20 and to form an interconnect (e.g., contact or via plug) 32 filling the first opening 28. The protective DARC layer 20 is used as a CMP stop whereby the protective DARC layer prevents microscratches in the dielectric layer 14.

FIG. 7 shows another embodiment where the first opening is a dual damascene opening. The conductive layer forms a dual damascene interconnection 132. The invention's protective DARC layer 120 functions as described above.

Benefits of the Invention

The invention provides the following benefits. The invention's protective SiON or PE-oxide DARC layer 20 provides superior anti-reflective characteristics especially when applied to deep ultra violet (DUV) photo processes. The invention's DARC layer eliminates the need to use an organic BARC. The inventor has found that compared to a Organic BARC, SiN ARC layer or oxide layer not formed using a plasma enhanced process, the invention SiON and PE-Ox layer 20 has superior anti-reflective characteristics and scratch filling properties.

Moreover, the invention's DARC layer fills in microscratches in dielectric layer from previous chemical-mechanical polishing planarization processes.

The invention's SiON DARC layer also is a superior CMP stop layer for the metal fill CMP. The protective DARC layer prevents microscratches form chemical-mechanical polish processes.

In all these aspects, the invention's SiON layer is superior to a Silicon nitride layer or a SiN/SiON Stack or a oxide not formed using a PE process. Specifically, the inventors have found that compared to SiN, the invention's SiON protective layer has (1) superior photo characteristics;

(2) SiON chemical-mechanical polishes better than silicon nitride; and (3) etches via/contact easier for $SiON/SiO_2$ than $Si_3N_4/SiO_2$ stack.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of forming a SiON dielectric anti-reflective coating (DARC) for a contact or via opening; comprising the steps of:

a) forming dielectric layer over a semiconductor structure;

b) chemical-mechanical polishing said dielectric layer whereby said chemical-mechanical polish creates microscratches in said dielectric layer;

c) forming a protective DARC layer over said dielectric layer whereby said protective DARC layer fills in said microscratches in said dielectric layer after said chemical-mechanical polishing in step (b); said protective DARC layer formed composed of Silicon oxynitride formed using a plasma enhanced chemical vapor deposition process; said protective DARC layer has a thickness of between about 600 and 1400 Å and a index of refraction of between 2 and 2.3 at a wavelength of 248 nm; and a coefficient of extinction between 0.6 and 0.7, and and a molar concentrations of between 42 to 47% Si and 36 to 40% O, and 5 to 9% N and 8 to 12% H;

d) forming a photoresist layer over said dielectric anti-reflective coating (DARC) layer;

e) exposing, and developing said photoresist layer to create a first resist opening; said photoresist layer is exposed using I-line DUV light with a wavelength between 245 and 264 nm;

f) etching said protective DARC layer and said dielectric layer through said first resist opening to form a first opening;

g) removing said photoresist layer;

h) forming a conductive layer over said protective DARC layer and filling said first opening;

i) chemical-mechanical polishing said conductive layer to remove said conductive layer from over said Protective DARC layer and to form an interconnect filling said first opening; said Protective DARC layer is used as a CMP stop whereby said Protective DARC layer prevents microscratches in said dielectric layer.

2. The method of claim 1 wherein said first resist opening has an open dimension between about 0.2 and 0.4 $\mu$m.

3. The method of claim 1 wherein said opening is a dual damascene shaped opening and said interconnection is a dual damascene interconnection.

4. The method of claim 1 wherein said dielectric layer is an interlevel dielectric or a inter metal dielectric layer and said dielectric layer composed of oxide formed using a $O_3$-TEOS process or composed of a low –K dielectric.

5. The method of claim 1 wherein said first opening exposes a contact area on said substrate or a conductive line over said substrate.

6. A method of forming a SiON dielectric anti-reflective coating (DARC) for a contact or via opening; comprising the steps of:

a) forming dielectric layer over a semiconductor structure; said dielectric layer is an interlevel dielectric or a inter metal dielectric layer and said dielectric layer composed of oxide formed using a $O_3$-TEOS process or composed of a low −K dielectric b) chemical-mechanical polishing said dielectric layer whereby said chemical-mechanical polish creates microscratches in said dielectric layer;

c) forming a protective DARC layer over said dielectric layer whereby said protective DARC layer fills in said microscratches in said dielectric layer after said chemical-mechanical polishing in step (b); said protective DARC layer formed composed of Silicon oxynitride formed using a plasma enhanced chemical vapor deposition process comprising a Temperature between 300 and 400° C., using $SiH_4$, He, and $N_2O$ reactant gasses;

said Protective DARC layer has a thickness of between about 600 and 1400 Å and a index of refraction of between 2 and 2.3 at a wavelength of 248 nm; and a coefficient of extinction between 0.6 and 0.7, and a molar concentrations of between 42 to 47% Si and 36 to 40% O, and 5 to 9% N and 8 to 12% H;

d) forming a photoresist layer over said dielectric anti-reflective coating (DARC) layer;

e) exposing, and developing said photoresist layer to create a first resist opening; said photoresist layer is exposed using I-line DUV light with a wavelength between 245 and 264 nm;

f) etching said protective DARC layer and said dielectric layer through said first resist opening to form a first opening; said first opening exposes a conductive line over said substrate; said first resist opening has an open dimension between about 0.2 and 0.4 μm;

g) removing said photoresist layer;

h) forming a conductive layer over said protective DARC layer and filling said first opening;

i) chemical-mechanical polishing said conductive layer to remove said conductive layer from over said Protective DARC layer and to form an interconnect filling said first opening; said Protective DARC layer is used as a CMP stop whereby said Protective DARC layer prevents microscratches in said dielectric layer.

7. A method of forming a SiON dielectric anti-reflective coating (DARC) for a contact or via opening; comprising the steps of:

a) forming dielectric layer over a semiconductor structure; said dielectric layer is an interlevel dielectric or a inter metal dielectric layer and said dielectric layer composed of oxide formed using a $O_3$-TEOS process or composed of a low −K dielectric b) chemical-mechanical polishing said dielectric layer whereby said chemical-mechanical polish creates microscratches in said dielectric layer;

c) forming a protective DARC layer over said dielectric layer whereby said protective DARC layer fills in said microscratches in said dielectric layer after said chemical-mechanical polishing in step (b); said protective DARC layer formed composed of Silicon oxynitride formed using a plasma enhanced chemical vapor deposition process comprising Temperature between 300 and 400° C., pressure between about 5 and 6 torr, $SiH_4$ gas flow between 60 and 80 sccm, He gas flow between 1900 and 2300 sccm, a $N_2O$ flow between 90n and 1210 sccm, and a power between 100 and 150 W;

said Protective DARC layer has a thickness of between about 600 and 1400 Å and a index of refraction of between 2 and 2.3 at a wavelength of 248 nm; and a coefficient of extinction between 0.6 and 0.7, and a molar concentrations of between 42 to 47% Si and 36 to 40% O, and 5 to 9% N and 8 to 12% H;

d) forming a photoresist layer over said dielectric anti-reflective coating (DARC) layer;

e) exposing, and developing said photoresist layer to create a first resist opening; said photoresist layer is exposed using I-line DUV light with a wavelength between 245 and 264 nm;

f) etching said protective DARC layer and said dielectric layer through said first resist opening to form a first opening; said first opening exposes a conductive line over said substrate; said first resist opening has an open dimension between about 0.2 and 0.4 μm;

g) removing said photoresist layer;

h) forming a conductive layer over said protective DARC layer and filling said first opening;

i) chemical-mechanical polishing said conductive layer to remove said conductive layer from over said Protective DARC layer and to form an interconnect filling said first opening; said Protective DARC layer is used as a CMP stop whereby said Protective DARC layer prevents microscratches in said dielectric layer.

* * * * *

UNITED STATES PATENT AND TRADEMARK OFFICE

CERTIFICATE OF CORRECTION

PATENT NO. : 6,228,760 B1
DATED : May 8, 2001
INVENTOR(S) : Chen-Hua Yu, Syun-Ming Jang, Tsu Shih, Anthony Yen, Jih-Churng Twu It is certified that error appears in the above-identified patent and that said Letters Patent is hereby corrected as shown below:

Title page,
Item [75], please change the last listed Inventor's (Jih-Churng Twu) address to read -- Taipei, Taiwan --.

Signed and Sealed this

Twenty-sixth Day of March, 2002

*Attest:*

JAMES E. ROGAN

*Attesting Officer*

*Director of the United States Patent and Trademark Office*